United States Patent
Arvin et al.

(10) Patent No.: US 10,833,051 B2
(45) Date of Patent: Nov. 10, 2020

(54) PRECISION ALIGNMENT OF MULTI-CHIP HIGH DENSITY INTERCONNECTS

(71) Applicant: International Business Machines Corporation, Armonk, NY (US)

(72) Inventors: Charles L. Arvin, Poughkeepsie, NY (US); Thomas Weiss, Poughkeepsie, NY (US); Thomas Anthony Wassick, LaGrangeville, NY (US); Steve Ostrander, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/256,344

(22) Filed: Jan. 24, 2019

(65) Prior Publication Data

US 2020/0243479 A1 Jul. 30, 2020

(51) Int. Cl.
*H01L 23/00* (2006.01)
*H01L 25/00* (2006.01)

(52) U.S. Cl.
CPC .............. *H01L 24/82* (2013.01); *H01L 24/76* (2013.01); *H01L 25/50* (2013.01); *H01L 2224/82136* (2013.01); *H01L 2924/37001* (2013.01)

(58) Field of Classification Search
CPC combination set(s) only.
See application file for complete search history.

(56) References Cited

U.S. PATENT DOCUMENTS

| 5,182,632 | A | 1/1993 | Bechtel et al. |
| 5,250,843 | A | 10/1993 | Eichelberger |
| 6,077,723 | A | 6/2000 | Farnworth et al. |
| 7,112,467 | B2 | 9/2006 | Eichelberger et al. |
| 8,072,059 | B2 | 12/2011 | Shim et al. |
| 9,281,268 | B2 | 3/2016 | Chow et al. |
| 9,875,969 | B2 | 1/2018 | Brunish et al. |
| 2009/0085183 | A1* | 4/2009 | Mitchell ................. H01L 23/10 257/686 |
| 2010/0320588 | A1* | 12/2010 | Dahilig ................. H01L 21/561 257/690 |
| 2017/0005066 | A1* | 1/2017 | Ayala ...................... H01L 24/75 |
| 2018/0061741 | A1* | 3/2018 | Beyne ................. H01L 25/0652 |
| 2020/0006235 | A1* | 1/2020 | Aleksov ............. H01L 25/0652 |

* cited by examiner

*Primary Examiner* — Telly D Green
*Assistant Examiner* — Andre C Stevenson
(74) *Attorney, Agent, or Firm* — Steven Meyers; Otterstedt, Wallace & Kammer, LLP

(57) ABSTRACT

Place a first semiconductor chip onto an alignment carrier with protrusions of the semiconductor chip inserted into corresponding cavities of the alignment carrier, so that the protrusions and cavities locate the semiconductor chip with interconnect contacts overlying a window that is formed through the alignment carrier. Place a second semiconductor chip onto the alignment carrier with protrusions of the second semiconductor chip inserted into cavities of the alignment carrier, so that the protrusions and cavities locate the second semiconductor chip with interconnect contacts of the second semiconductor chip adjacent to the interconnect contacts of the first semiconductor chip and overlying the window. Fasten the semiconductor chips to the alignment carrier. Touch contacts of a interconnect bridge against the interconnect contacts of the first and second semiconductor chips by putting the interconnect bridge through the window.

20 Claims, 5 Drawing Sheets

PRECISION ALIGNMENT OF MULTI-CHIP HIGH DENSITY INTERCONNECTS

BACKGROUND

The present invention relates to the electrical, electronic, and computer arts, and more specifically, to assembling semiconductor chips into modules.

Semiconductor device yield scales exponentially as the inverse of die size. Smaller chips yield higher, cost less, and offer better wafer utilization. Performance, however, scales with die size. Bigger chips offer higher performance.

A multi-chip module (MCM) allows for aggregating performance of multiple smaller chips to approximate the performance of a bigger chip. Performance of an MCM is limited by band-width (number of electrical channels) and latency (length) of chip-to-chip interconnections. Ideally, an MCM would have close chip-to-chip placement with a very high density of chip-to-chip wiring (high density interconnects). Interconnects for power delivery and off-module signaling would not necessarily benefit from the same level of wiring density as the chip-to-chip interconnect.

Chip-to-chip high density interconnect (HDI) bridges have been proposed as a method for providing local HDI, while maintaining traditional less-dense wiring for power delivery and off-module signal impedance matching.

SUMMARY

Principles of the invention provide techniques for precision alignment of multi-chip high density interconnects. In one aspect, an exemplary method includes placing a first semiconductor chip onto an upper surface of an alignment carrier with a first group of protrusions of the first semiconductor chip inserted into a corresponding first group of cavities on the upper surface of the alignment carrier. The first groups of protrusions and cavities locate the first semiconductor chip with interconnect contacts of the first semiconductor chip overlying a window that is formed through the alignment carrier. The method also includes placing a second semiconductor chip onto the upper surface of the alignment carrier with a second group of protrusions of the second semiconductor chip inserted into a corresponding second group of cavities on the upper surface of the alignment carrier. The second groups of protrusions and cavities locate the second semiconductor chip with interconnect contacts of the second semiconductor chip adjacent to the interconnect contacts of the first semiconductor chip and overlying the window. The method also includes fastening the first and second semiconductor chips to the alignment carrier; and touching contacts of a interconnect bridge against the interconnect contacts of the first and second semiconductor chips by putting the interconnect bridge through the window.

According to another aspect, an exemplary method includes touching contacts of an interconnect bridge against interconnect contacts of first and second semiconductor chips that are held in an alignment carrier with their interconnect contacts adjacent to a window formed through the alignment carrier, by putting the interconnect bridge through the window. The method also includes electrically and mechanically connecting the interconnect bridge contacts to the interconnect contacts of the first and second semiconductor chips by reflowing solder between the interconnect bridge contacts and the interconnect contacts of the first and second semiconductor chips.

According to another aspect, an alignment carrier has a window formed through it and has a surface indented with first and second groups of cavities for receiving respective first and second groups of protrusions of respective first and second semiconductor chips. The first and second groups of cavities are disposed at corners of generally rectilinear central hollows separated by a midline ridge. The groups of cavities and protrusions locate the first and second semiconductor chips in mutual alignment with interconnect contacts of the first and second semiconductor chips aligned to the window. Optionally, a pick and place tool is movable to position the first and second semiconductor chips on the alignment carrier In view of the foregoing, techniques of the present invention can provide substantial beneficial technical effects. For example, one or more embodiments provide one or more of:

Precise alignment of HDI bridge contacts to chip contacts.

Rapid assembly of HDI bridges to chips.

Reflow of HDI bridge contact solder with minimal tooling.

These and other features and advantages of the present invention will become apparent from the following detailed description of illustrative embodiments thereof, which is to be read in connection with the accompanying drawings.

The views of the several figures are schematic in nature, not necessarily all to the same scale, and different portions of each figure may be to different scales for convenience of illustration. Throughout the drawings, similar components are similarly numbered and subsequent similar components, in general, are described as to how they differ from preceding components.

DETAILED DESCRIPTION

Advantageously, one or more embodiments enable precise placement of a high density interconnect (HDI) bridge onto interconnect contacts of a plurality of semiconductor chips (in a non-limiting example, two chips). Additionally, one or more embodiments enable high-throughput assembly of HDI bridges to chips. Furthermore, one or more embodiments enable connecting an HDI bridge to chips by reflowing solder between the HDI bridge contacts and the interconnect contacts of the chips, with minimal tooling to support the bridge and the chips.

Typically, it is challenging to place an HDI bridge onto a plurality of semiconductor chips so that all of the interconnect contacts of the chips and the HDI bridge line up precisely. However, one aspect of the invention mitigates this challenge by providing an alignment carrier and a support plate that hold the semiconductor chips in place with reference to a window that provides an alignment target for the HDI bridge.

Figure 10:
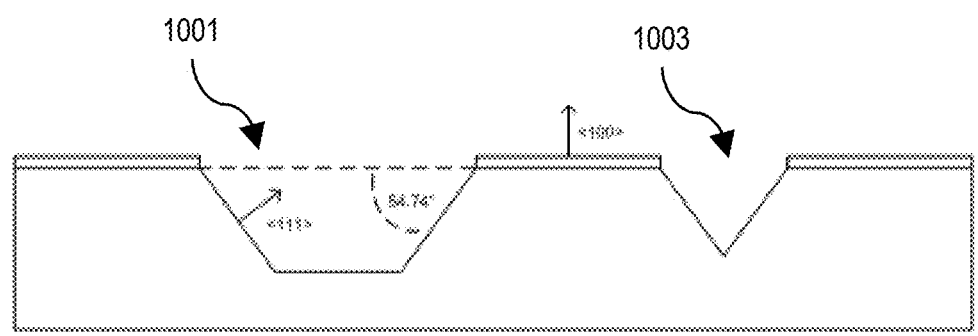
FIG. 10 depicts in side sectional view details of an anisotropically etched version of the apparatus of FIG. 2.

According to FIGS. 1 through 5, an exemplary method 100 for precisely placing an interconnect bridge 224 (seen in FIG. 5) onto interconnect contacts 210, 220 of two semiconductor chips 201, 214 can be implemented using an apparatus 200. The interconnect bridge can include, for example, a chip or silicon device, an organic interposer, a wiring structure, and the like. The method 100 includes, at 102, placing a first semiconductor chip 201 onto an upper surface 202 of an alignment carrier 204 with a first group of protrusions 206 of the first semiconductor chip inserted into a corresponding first group of cavities 208 (shown in simplified form as pyramidal but can be truncated pyramids as seen in FIG. 10) on the upper surface of the alignment carrier. In one or more embodiments, the first group of protrusions 206 are the controlled collapse chip connection ("C4") solder balls that are provided on the first semiconductor chip for other purposes as known to the skilled artisan. The first groups of protrusions and cavities locate the first semiconductor chip with interconnect contacts 210 of the first semiconductor chip overlying a window 212 that is formed through the alignment carrier.

Figure 1:
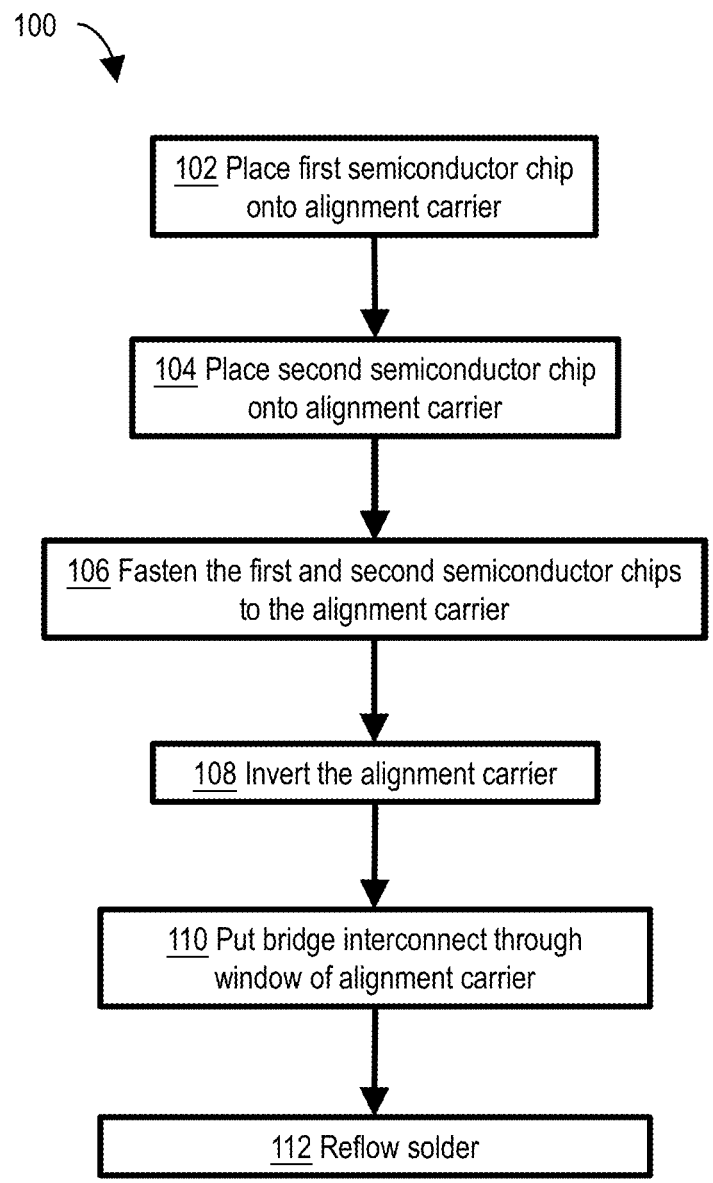
FIG. 1 depicts as a flowchart a method for precisely placing a high density interconnect (HDI) bridge onto two semiconductor chips, according to an exemplary embodiment.
Figure 2:
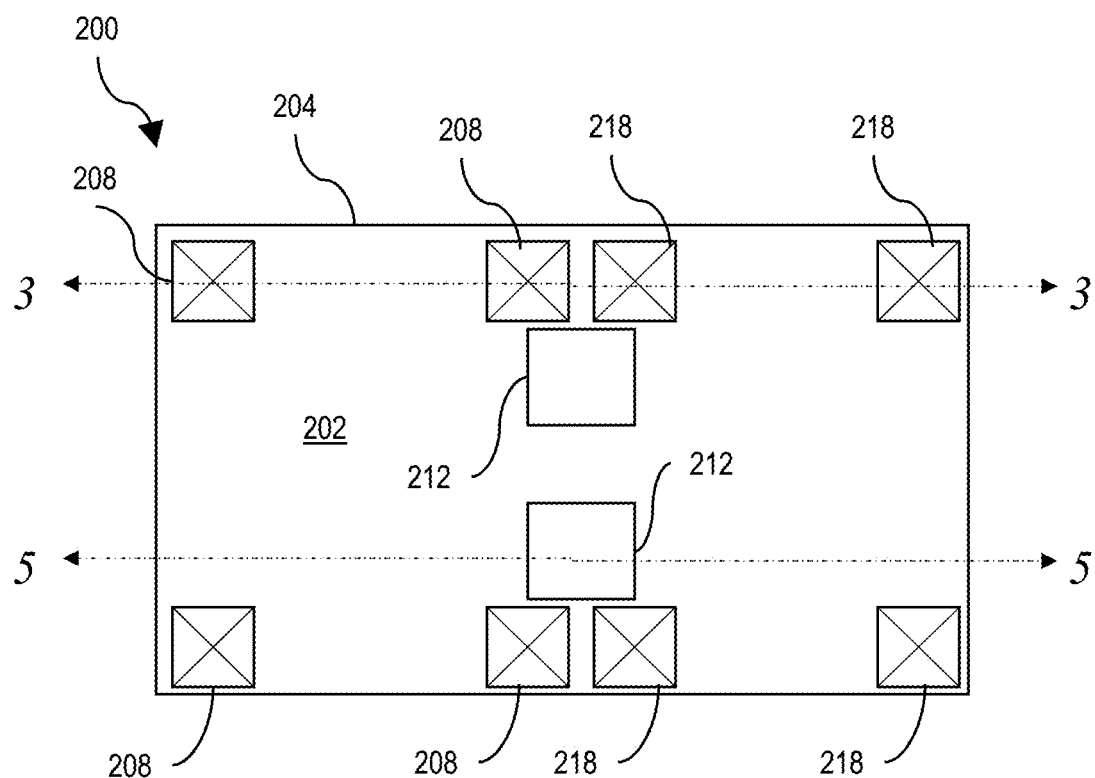
FIG. 2 depicts a top view of an apparatus for implementing the method of FIG. 1, according to an exemplary embodiment.
Figure 3:
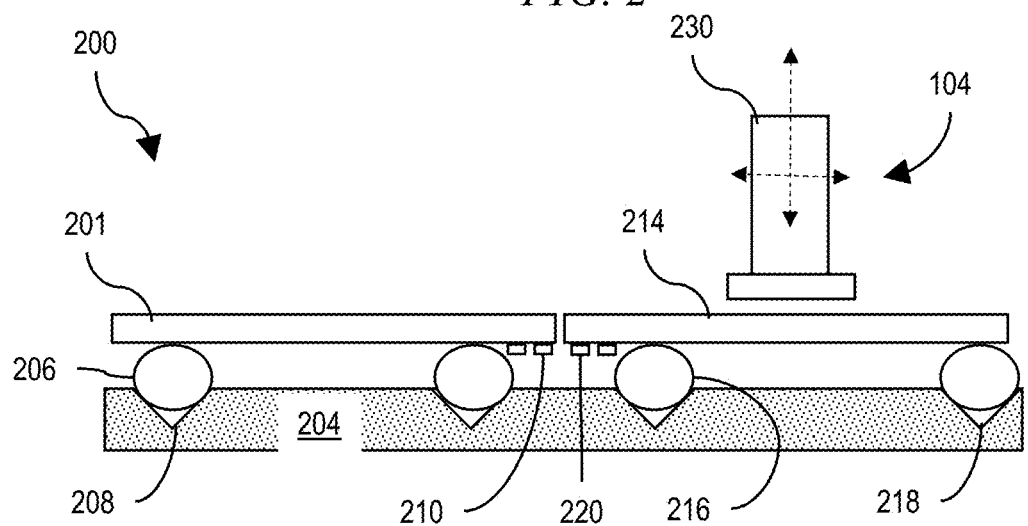
FIG. 3 depicts a step of the method of FIG. 1 in a side sectional view taken along line 3-3 in FIG. 2.

Then at 104, the method 100 includes placing a second semiconductor chip 214 onto the upper surface 202 of the alignment carrier 204 with a second group of protrusions 216 of the second semiconductor chip inserted into a corresponding second group of cavities 218 (shown in simplified form as pyramidal but can be truncated pyramids as seen in FIG. 10) on the upper surface of the alignment carrier, as shown in FIG. 3. In one or more embodiments, similarly to the first group of protrusions 206, the second group of protrusions 216 also are C4 solder balls. Repeatability of solder ball placement on the chips enables precise alignment of the chips by inserting the solder balls into the cavities 208, 218 on the alignment carrier 204. The second groups of protrusions and cavities locate the second semiconductor chip with interconnect contacts 220 of the second semiconductor chip adjacent to the interconnect contacts 210 of the first semiconductor chip and overlying the window 212.

Figure 4:
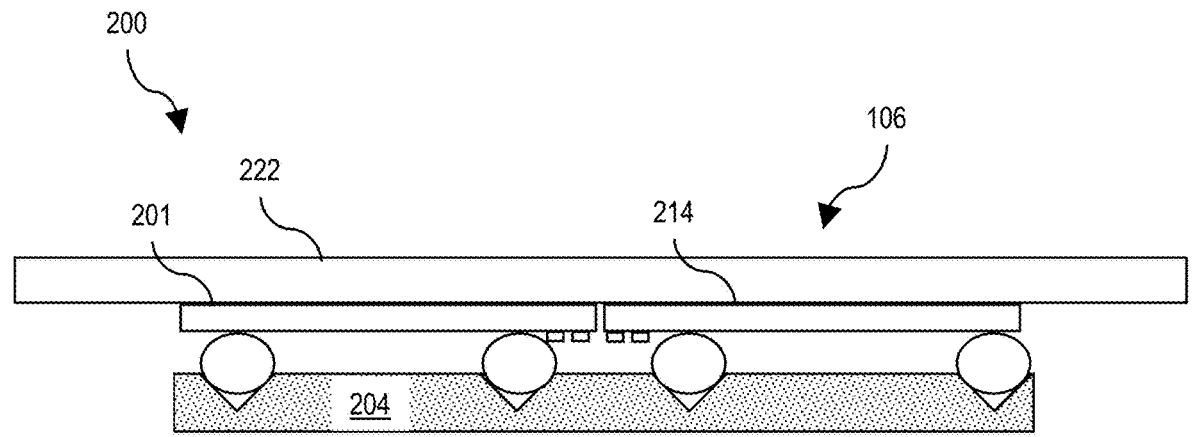
FIG. 4 depicts another step of the method of FIG. 1 in another side sectional view taken along line 3-3 in FIG. 2.

At 106, the method 100 further includes fastening the first and second semiconductor chips 201, 214 to the alignment carrier 204. In one or more embodiments, the step 106 of fastening the first and second semiconductor chips 201, 214 to the alignment carrier 204 includes clamping the first and second semiconductor chips between the alignment carrier and a support plate 222, as shown in FIG. 4.

Figure 5:
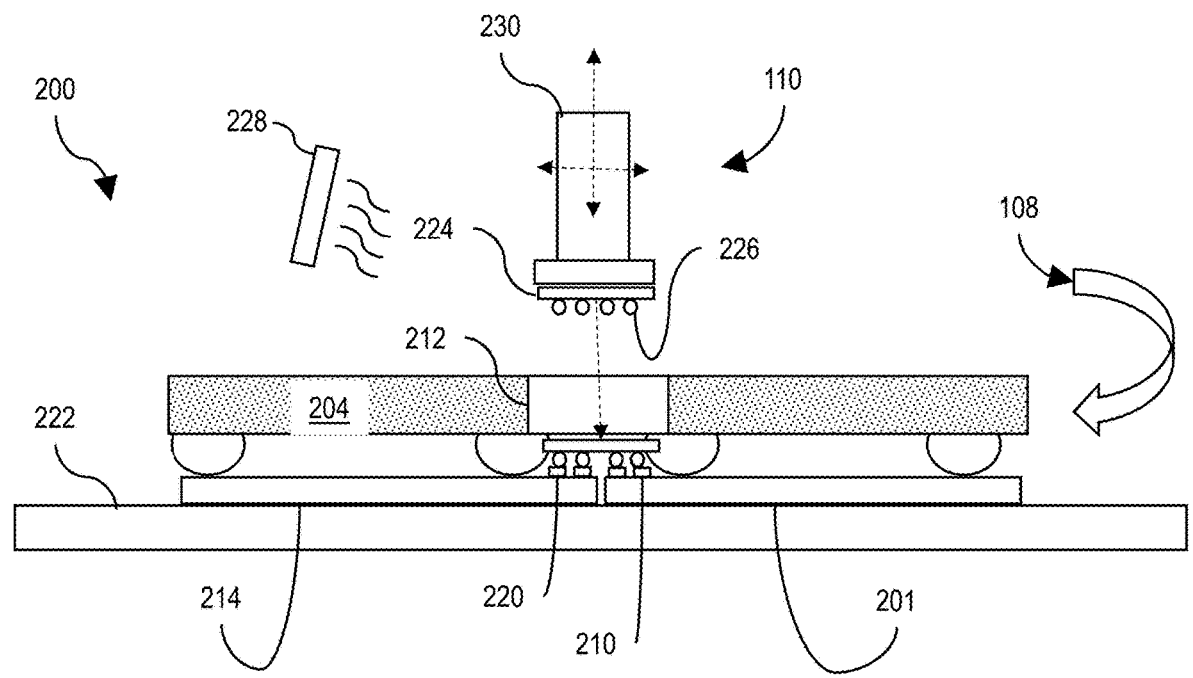
FIG. 5 depicts yet another step of the method of FIG. 1 in a side sectional view taken along line 5-5 in FIG. 2.

The method 100 includes an additional (optional) step 108 of inverting the alignment carrier 204 and the support plate 222, as shown in FIG. 5, after clamping the first and second semiconductor chips 201, 214 and before putting the interconnect bridge 224 through the window 212.

Then at 110, the method 100 includes touching contacts 226 of the interconnect bridge 224 against the interconnect contacts 210, 220 of the first and second semiconductor chips 201, 214 by putting the interconnect bridge through the window 212. In one or more embodiments, the interconnect bridge 224 is touched against the semiconductor chips 201, 214 while the first and second semiconductor chips 201, 214 are fastened to the alignment carrier 204.

In one or more embodiments, the method 100 further includes at 112, reflowing solder between the interconnect bridge contacts 226 and the interconnect contacts 210, 220 of the first and second semiconductor chips 201, 214 by energizing a heating element 228 (as shown in FIG. 5). In one or more embodiments, the solder is originally disposed on the interconnect bridge. In one or more embodiments, solder reflow is accomplished while the first and second semiconductor chips 201, 214 are clamped against the alignment carrier, and after putting the interconnect bridge 224 through the window 212. Solder reflow completes the method 100 by electrically and mechanically connecting the interconnect bridge to the first and second semiconductor chips.

In one or more embodiments, the step 110 of putting the interconnect bridge 224 through the window 212 includes pressing the interconnect bridge upward or downward against the first and second semiconductor chips 201, 214.

Thus, the apparatus 200 includes the alignment carrier 204, which has a window 212 formed through it and has a surface 202 that is indented with first and second groups of cavities 208, 218 for receiving respective first and second groups of protrusions 206, 216 of respective first and second semiconductor chips 201, 214. The groups of cavities 208, 218 and protrusions 206, 216 locate the first and second semiconductor chips 201, 214 in mutual alignment, with interconnect contacts 210, 220 of the first and second semiconductor chips aligned to the window 212.

In one or more embodiments, the apparatus 200 also includes a pick and place tool 230 (shown, e.g., in FIGS. 3 and 5) that is movable vertically and laterally, as indicated by the dashed arrows, to position the first and second semiconductor chips 201, 214 on the alignment carrier 204. Additionally, the pick and place tool 230 also is movable to put the interconnect bridge 224 through the window 212, with contacts 226 of the interconnect bridge touching the interconnect contacts 210, 220 of the first and second semiconductor chips 201, 214.

In one or more embodiments, the apparatus 200 also includes fasteners which releasably fasten the first and second semiconductor chips 201, 214 to the alignment carrier 204. For example, the fasteners may include the support plate 222 that is movable to clamp the first and second semiconductor chips against the alignment carrier and to release the first and second semiconductor chips from the alignment carrier. As another example, the fasteners may include an attach adhesive and a release adhesive. In such embodiments, the attach adhesive is curable by ultraviolet light and is deposited above the upper surface 202 of the alignment carrier 204, whereas the release adhesive is degradable by ultraviolet light and is deposited below the attach adhesive. In one or more embodiments, the attach adhesive is opaque to ultraviolet light and the alignment carrier is transparent to ultraviolet light.

In one or more embodiments, the alignment carrier 204 is silicon and the surface 202 of the alignment carrier first is planarized by chemical mechanical polishing, then is indented by micromachining to provide the first and second groups of cavities 208, 218. In other embodiments, silicon bulk etching or other techniques are used to form the cavities 208, 218. In other embodiments, the apparatus 200 can be formed by layering precision-cut Kapton™ (a registered trademark of E. I. du Pont de Nemours and Company) tape.

Figure 6:
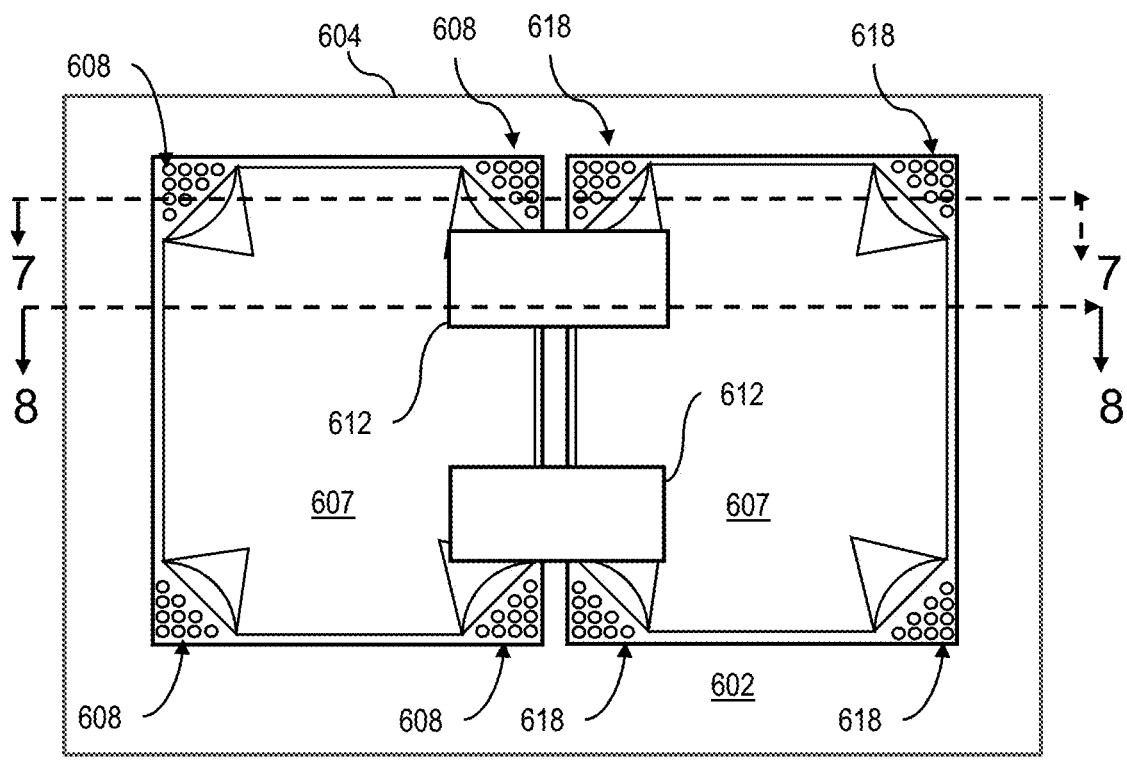
FIG. 6 depicts a top view of a more detailed version of the apparatus of FIG. 2, according to an exemplary embodiment.
Figure 7:
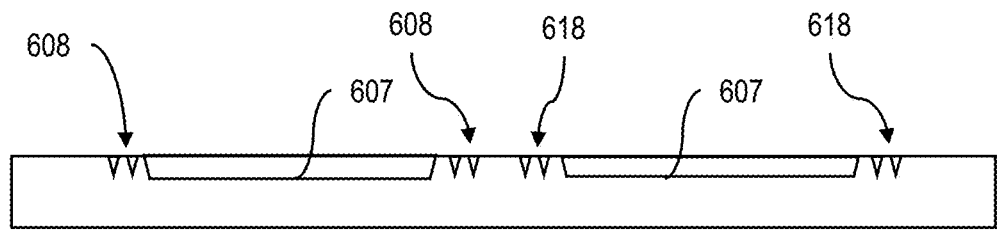
FIG. 7 depicts a side sectional view of the apparatus of FIG. 6 taken along line 7-7.
Figure 8:
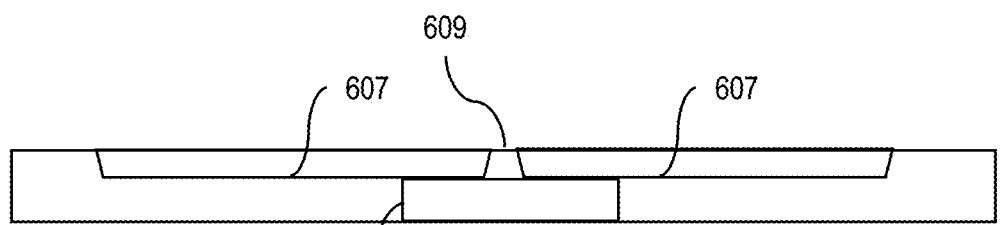
FIG. 8 depicts a side sectional view of the apparatus of FIG. 6 taken along line 8-8.

According to another exemplary embodiment, as depicted in FIGS. 6-8, an alignment carrier 604 has an upper surface 602 with a plurality of relatively large hollows 607 (in some embodiments, two hollows) indented into the upper surface 602 and with pluralities of relatively smaller cavities 608, 618 (shown in simplified form as pyramidal but can be truncated pyramids as seen in FIG. 10) indented at corners of the plurality of hollows 607. The hollows 607 are dimensioned to accommodate central groups of C4 solder balls of a typical semiconductor die, while the smaller cavities 608, 618 are dimensioned to receive single C4 solder balls at corners of a typical semiconductor die. Thus, the cavities 608, 618 locate a pair of semiconductor dies in mutual alignment. In this exemplary embodiment, the hollows 607 define a ridge 609 therebetween. Windows 612 are formed through the body of the alignment carrier 604 at the midline thereof, i.e. crossing the ridge 609.

Figure 9:
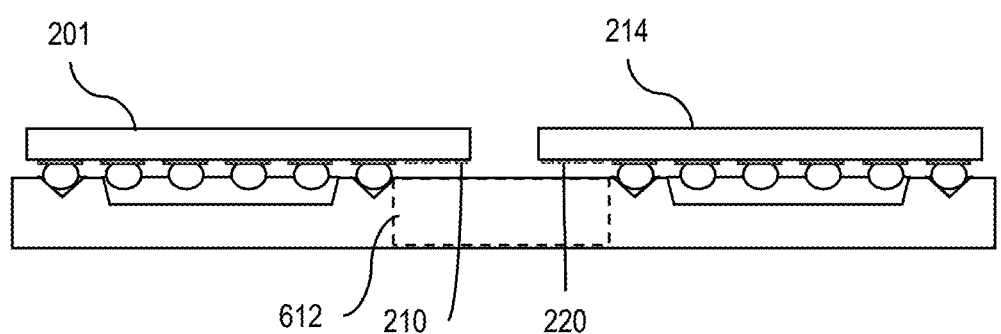
FIG. 9 depicts in side sectional view of a pair of semiconductor dies juxtaposed with the apparatus of FIG. 6.

As shown in FIG. 9, when semiconductor dies 201, 214 are placed onto the alignment carrier 604, the dies are aligned so that interconnect contacts 210, 220 of the dies overlie the windows 612.

FIG. 10 depicts in side sectional view an anisotropically etched indentation 1001 in bulk silicon. Notably, when a wet etch is used on bulk silicon with <100> and <111> crystal planes oriented as shown, the etch forms indentations with sidewalls at approximately 54.74° to the surface. Although in the other drawing figures (for convenience of illustration) all of the cavities 208, 218, 608, 618 are shown in a simplified form 1003 as generally pyramidal, it will be appreciated that the cavities may instead be in the form of truncated pyramids 1001 as shown in FIG. 10.

It should also be noted that in one or more embodiments, the windows formed in an alignment carrier may be so big that they receive almost all of the solder balls present on the undersides of the semiconductor dies being placed on the alignment carrier. In such instance, the corner cavities alone will suffice to accurately position the semiconductor dies.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    placing a first semiconductor chip onto an upper surface of an alignment carrier with a first group of protrusions of the first semiconductor chip inserted into a corresponding first group of cavities on the upper surface of the alignment carrier, wherein the first groups of protrusions and cavities locate the first semiconductor chip with interconnect contacts of the first semiconductor chip overlying a vacant window that is formed through the alignment carrier;
    placing a second semiconductor chip onto the upper surface of the alignment carrier with a second group of protrusions of the second semiconductor chip inserted into a corresponding second group of cavities on the upper surface of the alignment carrier, wherein the second groups of protrusions and cavities locate the second semiconductor chip with interconnect contacts of the second semiconductor chip adjacent to the interconnect contacts of the first semiconductor chip and overlying the window;
    fastening the first and second semiconductor chips to the alignment carrier; and
    then touching contacts of an interconnect bridge against the interconnect contacts of the first and second semiconductor chips by putting the interconnect bridge through the window.

2. The method of claim 1, wherein, in the touching step, the contacts of the interconnect bridge are touched bridge against the interconnect contacts of the first and second semiconductor chips while the first and second semiconductor chips are fastened to the alignment carrier.

3. The method of claim 2 wherein fastening the first and second semiconductor chips to the alignment carrier includes clamping the first and second semiconductor chips between the alignment carrier and a support plate, further comprising:
    inverting the alignment carrier and the support plate after clamping the first and second semiconductor chips and before putting the interconnect bridge through the window.

4. The method of claim 3 further comprising:
    while the first and second semiconductor chips are clamped, and after putting the interconnect bridge through the window, electrically and mechanically connecting the interconnect bridge to the first and second semiconductor chips by reflowing solder between the interconnect bridge contacts and the interconnect contacts of the first and second semiconductor chips.

5. The method of claim 2 wherein putting the interconnect bridge through the window includes pressing the interconnect bridge against the first and second semiconductor chips.

6. The method of claim 5 further comprising, while pressing the interconnect bridge against the first and second semiconductor chips, electrically and mechanically connecting the interconnect bridge to the first and second semiconductor chips by reflowing solder between the interconnect bridge contacts and the interconnect contacts of the first and second semiconductor chips.

7. The method of claim 6 wherein the solder is originally disposed on the interconnect bridge.

8. A method comprising:
    touching contacts of an interconnect bridge against interconnect contacts of first and second semiconductor chips that are held in an alignment carrier with their interconnect contacts adjacent to a vacant window formed through the alignment carrier, by putting the interconnect bridge through the window; and
    electrically and mechanically connecting the interconnect bridge contacts to the interconnect contacts of the first and second semiconductor chips by reflowing solder between the interconnect bridge contacts and the interconnect contacts of the first and second semiconductor chips.

9. The method of claim 8, further comprising fastening the first and second semiconductor chips to the alignment carrier.

10. The method of claim 9, further comprising inverting the alignment carrier after fastening the first and second semiconductor chips and before putting the interconnect bridge through the window.

11. The method of claim 8, wherein touching the contacts of the interconnect bridge to the interconnect contacts of the first and second semiconductor chips includes pressing the interconnect bridge against the first and second semiconductor chips.

12. An apparatus comprising:
an alignment carrier that has a window formed through it and that has a surface indented with first and second groups of cavities for receiving respective first and second groups of protrusions of respective first and second semiconductor chips, the first and second groups of cavities being disposed at corners of generally rectilinear central hollows separated by a midline ridge, such that the groups of cavities and protrusions locate the first and second semiconductor chips in mutual alignment with interconnect contacts of the first and second semiconductor chips aligned to the window.

13. The apparatus of claim 12 further comprising a pick and place tool that is movable to position the first and second semiconductor chips on the alignment carrier.

14. The apparatus of claim 13 wherein the pick and place tool is movable to put an interconnect bridge through the window with contacts of the interconnect bridge touching the interconnect contacts of the first and second semiconductor chips.

15. The apparatus of claim 14 further comprising the interconnect bridge.

16. The apparatus of claim 15 further comprising a fastener which releasably fastens the first and second semiconductor chips to the alignment carrier.

17. The apparatus of claim 16 wherein the fastener comprises a support plate that is movable to clamp the first and second semiconductor chips against the alignment carrier and to release the first and second semiconductor chips from the alignment carrier.

18. The apparatus of claim 16 wherein the fastener comprises an attach adhesive and a release adhesive, wherein the attach adhesive is curable by ultraviolet light and is deposited above the upper surface of the alignment carrier, wherein the release adhesive is degradable by ultraviolet light and is deposited above or below the attach adhesive, wherein the alignment carrier is transparent to ultraviolet light.

19. The apparatus of claim 15 further comprising a heating element for reflowing solder to electrically and mechanically connect the interconnect bridge to the first and second semiconductor chips.

20. The apparatus of claim 12 wherein the alignment carrier is silicon and the surface of the alignment carrier first is planarized by chemical mechanical polishing, then is indented by micromachining to provide the first and second groups of cavities.

* * * * *